US007655497B1

(12) United States Patent
Yu et al.

(10) Patent No.: US 7,655,497 B1
(45) Date of Patent: Feb. 2, 2010

(54) GROWTH METHOD FOR CHALCONGENIDE PHASE-CHANGE NANOSTRUCTURES

(75) Inventors: Bin Yu, Cupertino, CA (US); Xuhui Sun, Santa Clara, CA (US); Meyya Meyyappan, San Jose, CA (US)

(73) Assignee: The United States of America as represented by the Administrator of the National Aeronautics and Space Administration, Washington, DC (US)

( * ) Notice: Subject to any disclaimer, the term of this patent is extended or adjusted under 35 U.S.C. 154(b) by 197 days.

(21) Appl. No.: 11/513,431

(22) Filed: Aug. 25, 2006

(51) Int. Cl.
*H01L 21/00* (2006.01)
(52) U.S. Cl. .................. 438/95; 438/102; 257/E27.001; 257/E27.004; 257/E27.114; 977/700; 977/902
(58) Field of Classification Search .................. 438/95, 438/102; 257/E27.001, E27.004, E27.114; 977/700, 902
See application file for complete search history.

(56) References Cited

U.S. PATENT DOCUMENTS

| 6,891,747 B2 | 5/2005 | Bez et al. |
| 7,075,131 B2 | 7/2006 | Chen |
| 7,138,687 B2 | 11/2006 | Lung et al. |
| 2008/0268288 A1* | 10/2008 | Jin ............................ 428/800 |

OTHER PUBLICATIONS

Atwood, et al., Current status of Chalcogenide phase change memory, Device Research Conference Digest, Dec. 12, 2005, 29-33, 1, IEEE Xplore.

Hamann, et al., Ultra-high-density phase-change storage and memory, Nature Materials, Apr. 9, 2006, 383-387, 5, Nature Publishing Group.

Lankhorst, et al., Low-cost and nanoscale non-volatile memory concept for future silicon chips, Nature Materials www.nature.com/naturematerials, Mar. 13, 2005, 347-352, 4, Nature Publishing Group.

Pirovano, et al., Electronic Switching in Phase-Change Memories, IEEE Transactions on Electron Devices, Mar. 2004, 452-459, 51-3, IEEE.

Huang, et al., Semiconductor Nanowires: Nanoscale Electronics and Optoelectronics, Encyclopedia of Nanoscience and Nanotechnology, J.A. Schwarz, Ed. Marcel Dekker, Inc., 2005, Taylor & Francis.

Kolobov, et al., Understanding the phase-change mechanism of rewritable optical media, Nano Materials www.nature.com/naturematerials, Sep. 12, 2004, 703-708, 3, Nature Publishing Group.

Xia, et al., One-Dimensional Nanostructures: Synthesis, Characterization, and Applications, Advanced Materials, Mar. 7, 2003, 353-389, 15-5, Wiley-VCH Verlag GmbH & Co. KGaA, Weinheim.

* cited by examiner

*Primary Examiner*—Charles D Garber
*Assistant Examiner*—Abdulfattah Mustapha
(74) *Attorney, Agent, or Firm*—John F. Schipper; Robert M. Padilla

(57) ABSTRACT

A method for growth of an alloy for use in a nanostructure, to provide a resulting nanostructure compound including at least one of $Ge_xTe_y$, $In_xSb_y$, $In_xSe_y$, $Sb_xTe_y$, $Ga_xSb_y$, $Ge_xSb_y$, $Te_z$, $In_xSb_yTe_z$, $Ga_xSe_yTe_z$, $Sn_xSb_yTe_z$, $In_xSb_yGe_z$, $Ge_wSn_xSb_yTe_z$, $Ge_wSb_xSe_yTe_z$, and $Te_wGe_xSb_yS_z$, where w, x, y and z are numbers consistent with oxidization states (2, 3, 4, 5, 6) of the corresponding elements. The melt temperatures for some of the resulting compounds are in a range 330-420° C., or even lower with some compounds.

10 Claims, 4 Drawing Sheets

GROWTH METHOD FOR CHALCONGENIDE PHASE-CHANGE NANOSTRUCTURES

FIELD OF INVENTION

Use of group VI-based alloys, including mixtures of Te, Se and S with In, Ge, Sb, In, Ga and/or Sn, for growth of high-purity alloy nanostructures such as nanodots, nanowires and nanorods, in large quantity,

BACKGROUND OF THE INVENTION

Materials engineering at the nanometer scale can provide smaller devices than those currently available. Recently, one-dimensional ("1-D") nanostructures, such as wires, rods, belts, and tubes, have become the focal point of research in nanotechnology due to their fascinating properties. These properties are intrinsically associated with low dimensionality and small diameters, which may lead to unique applications in various nanoscale devices. It is generally accepted that 1-D nanostructures provide an excellent test ground for understanding the dependence of physical, electrical, thermal, optical, and mechanical properties on material dimensionality and physical size. In particular, 1-D semiconductor nanostructures, which exhibit different properties as compared with their bulk or thin film counterpart, have shown great potential in future nanoelectronics applications in data storage, computing and sensing devices. Phase-change materials ("PCMs") are among the most promising media for nonvolatile, re-writable, and highly durable data storage applications. Phase change materials based on the Ge—Sb—Te multi-element alloy system have been extensively studied and have been found to be suitable for optical and electrical memories. Among these alloys, $Ge_2Sb_2Te_5$ ("GST") exhibits the best performance when used in a phase change random access nonvolatile memory (PRAM), for speed and stability. GST demonstrates high thermal stability at room temperature, high crystallization rate at high temperatures (can be crystallized in less than 50 nsec by laser heating pulse), and extremely good reversibility between amorphous and crystalline phases (more than $10^6$ cycles). In particular, resistive switching PRAM, using GST thin film as a phase change material, provides faster write/read, improved endurance, and simpler fabrication as compared with the transistor-based nonvolatile memories.

Although substantial improvements in the performance of thin-film-based PRAM have been made over the past decade, a number of issues remain, most notably, large programming current, limited cyclability and scaling problems when moving to increasingly smaller dimensions. There is particularly a concern about the crystalline-to-amorphous phase transition when high current is required for material melting. The Joule heating effect may cause excessive power dissipation and inter-cell thermal interference, presenting problems for further memory scaling.

The phase transition behavior of nanoscale GST may overcome these limitations. The melting temperature $T_{melt}$ of GST nanowire (e.g., 385° C. for ≈80 nm diameter) is reduced from that of bulk GST (632° C.), a phenomenon consistent with a previous report for semiconductor nanocrystals that reports a decrease of $T_{melt}$ with decreasing nanocrystal size. The thermal conductivity of a low-dimensional structure is also reduced relative to its bulk counterpart. The reduced $T_{melt}$, reduced thermal conductance, and smaller material volume jointly contribute to reduction of the threshold energy required for structural phase transition in GST nanostructures.

A bottom-up synthesis strategy provides a route to prepare various free-standing nanostructures, such as nanodots, nanotubes and nanowires. Some elements or binary compound 1D nanostructures have been synthesized by thermal evaporation, laser-ablation, chemical vapor deposition ("CVD"), and metalorganic chemical vapor deposition ("MOCVD"), etc. methods. One of the challenging issues in the field of PCM nanostructures is thesynthesis of high-quality, high purity Ge—Sb—Te ternary alloy nanowires and nanorods in large quantities.

What is needed is a growth method and associated growth materials for 1-D phase change nanostructures that provide a relatively low melt temperature (e.g., $T_{melt} \approx 400°$ C.) for diameters of the order of 10-100 nanometers (nm), and nanostructures that can easily be grown at pressures close to standard, ambient pressures.

SUMMARY OF THE INVENTION

These needs are met by the present invention, which provides a method for producing large quantities of 1-D nanostructures, such as nanowires and nanorods, of Ge—Sb—Te alloys and similar alloys from compounds such as GeTe and $Sb_2Te_3$, or Ge, Te and Sb element powders on any kind of substrates, using a thin film or nanoparticles of at least one of Au, Ni, Ti, Cr, In, Sb, Ge and Te as a growth catalyst. The atomic ratio in the Ge—Sb—Te alloy nanowires depends on the mole ratio of Ge:Sb:Te in the starting mixture. For example, $Ge_2Sb_2Te_5$ nanowires can be grown from the mixture of GeTe and $Sb_2Te_3$ with 2:1 mole ratio. The length of the 1-D nanostructures depends upon the growth time applied.

DESCRIPTION OF BEST MODES OF THE INVENTION

Figure 1A:
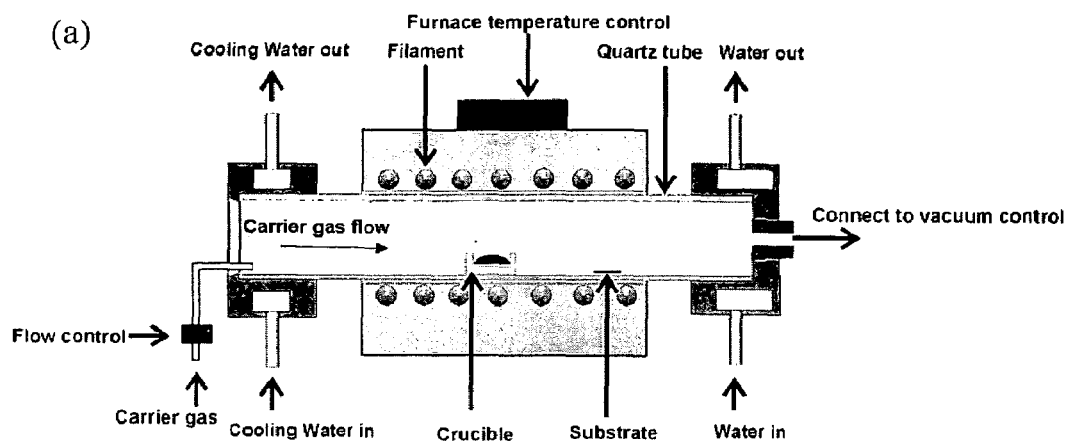
FIG. 1 is a schematic diagram of the thermal evaporation apparatus used for nanowire growth in the present invention (a) one-furnace system and (b) two-furnace system.
Figure 1B:
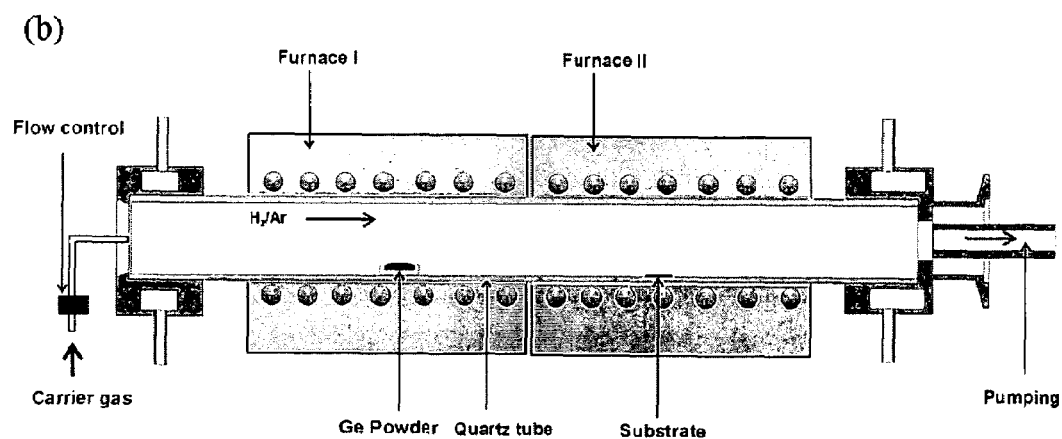

FIGS. 1A and 1B are schematic diagrams of apparati that can be used to produce GST nanowires using the disclosed method. FIGS. 1A and 1B show a one-furnace system and a two-furnace system, respectively. The apparatus includes a furnace with at least two temperature control regions 11-1 or 11-2, an evacuated tube reaction chamber 12, a pumping system 13 and/or a high power laser 14 (optional). In one embodiment, Ge, Te and Sb vapors are generated in a temperature range, T=300-950° C. by thermal heating or laser ablating of a solid source. GST nanowires grow at T=330-550° C. on a substrate (e.g., Si, $SiO_x$-coated on Si, $Al_2O_3$, SiC, SiN or another substance that is stable up to at least T=550° C.) with nanoparticles or a thin film (0.5-100 nm thickness) of at least one of Au, Ni, Ti, Cr, In, Sb, Ge and Te deposited thereon as a catalyst. During the growth period, the pressure in the reaction chamber 12 should be maintained at pressures p≈1-800 Torr, and preferably at p≈1-400 Torr. Generally, the composition of the GST alloy is $Ge_xSb_yTe_z$, where x, y and z are appropriate numbers, for example, x=2, y=2, z=5.

Figure 2:
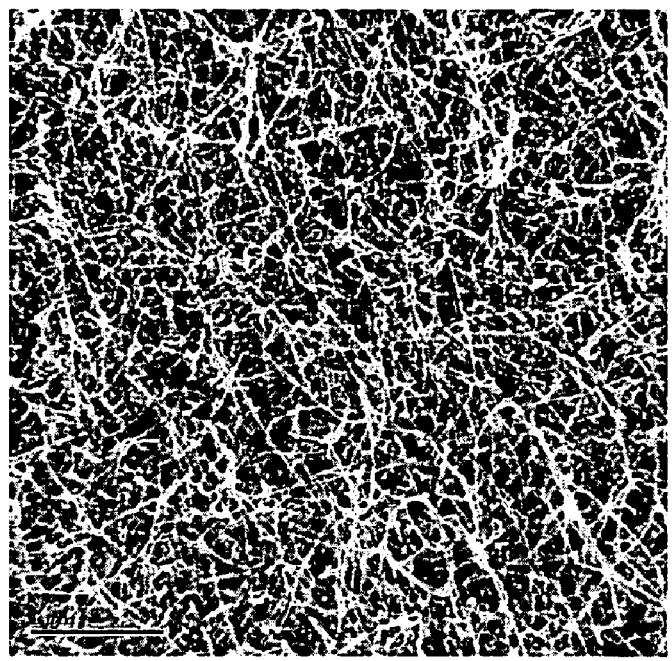
FIG. 2 is a scanning electron microscopy (SEM) micrograph showing the morphology of GST nanowires grown from the mixture of GeTe and $Sb_2Te_3$.
Figure 3:
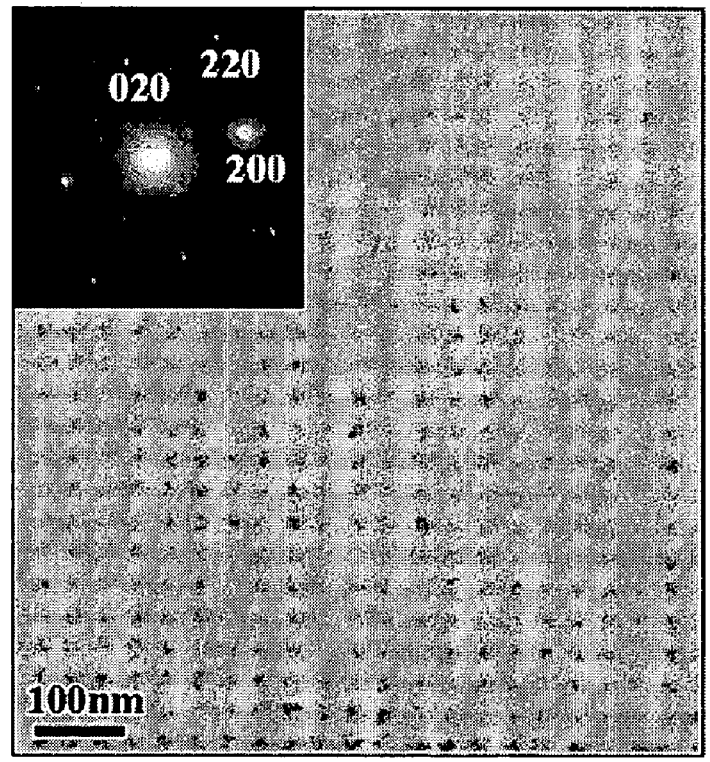
FIG. 3 is a transmission electron microscopic image taken from GST nanowire grown from a mixture of GeTe and $Sb_2Te_3$, with inset diffraction pattern.

FIG. 2 is a scanning electron microscopic image showing the morphology of GST nanowires grown by this method. The length of nanowires grown by this method depends on the growth time; the nanowire length can extend to more than ten micrometers ("μm") within several hours growth time. GST nanorods (length ≦1 micrometer) can be obtained within one hour. As illustrated in FIG. 3, the diameters of GST nanowires are very uniform (10 nm-100 nm, depending on the diameter of the catalyst nanoparticles). An electron diffraction pattern in the inset in FIG. 3 shows the perfect crystalline nature of the wire.

One example of a growth mechanism for Ge—Sb—Te alloy nanowires is a vapor-liquid-solid ("VLS") process. The vapor phase containing Ge, Sb and Te generated from solid sources, for example GeTe and $Sb_2Te_3$ powders, by thermal evaporation or other activation, is a key factor. The vapors of Ge, Sb, Te are transported to the substrate area by an inert carrier gas (He, Ne, Ar, $N_2$, etc.) and combined with Au catalyst particles to provide a liquid alloy at above-eutectic temperatures. Continuous feeding of the liquid alloy droplet increases Ge—Sb—Te concentration and eventually leads to super-saturation, precipitation, and axial growth of a nanowire of GST. This growth is independent of the nature of the substrates.

In the present invention, generating Ge, Sb and Te in vapor phase(s), by various methods, is a key point. Heating a powder mixture of Ge, Sb and Te elements is a direct approach to generate the vapor phase(s). Vapors of Ge, Sb and Te can be generated by many other means, such as activating a mixture of GeTe and $Sb_2Te_3$ powders. This activation can be implemented by laser ablation, thermal evaporation, plasma-assisted excitation, etc. After the Ge, Sb and Te vapors are produced, temperature and pressure control are imposed for growth of nanostructures (nanowires, nanorods, nanotubes, etc.). Ge, Sb and Te vapor phase can also be obtained directly through Ge, Sb and Te gas phase compounds, such as GeH, $(CH_3)_3Sb$ and $(CH_3)_2Te$, respectively.

Although $Ge_xSb_yTe_z$ serves as an example here, other alloy materials can also be synthesized through the methods described here, including but not limited to $Ge_xTe_y$, $In_xSb_y$, $In_xSe_y$, $Sb_xTe_y$, $Ga_xSb_y$, $Ge_xSb_yTe_z$, $In_xSb_yTe_z$, $Ga_xSe_yTe_z$, $Sn_xSb_yTe_z$, $In_xSb_yGe_z$, $Ge_wSn_xSb_yTe_z$, $Ge_wSb_xSe_yTe_z$, and $Te_wGe_xSb_yS_z$, where w, x, y and z are numbers consistent with oxidization states (2, 3, 4, 5, 6) of the corresponding elements.

Several elements are candidates for constituents for a binary, ternary or quaternary alloy for a phase change nanostructure grown according to the procedures discussed herein. These elements, and their corresponding oxidization states, includes the following groups: (III-A) Al (oxidization state 3), Ga (3), In (3) and Tl (1,3); (IV-A) Ge (4), Sn (4); (V-A) P (3.4), As (3), Sb (3); and (VI-A) S (2, 4, 6), Se (2, 4, 6), Te (2, 4, 6). A more general prescription for a ternary compound may be expressed as {Al or Ga or In or Tl or Ge or Sn}$_x${P or As or Sb}$_y${S or Se or Te}$_z$. A more general prescription for a quaternary compound may be expressed as {Ge or Sn}$_w${Ge or Sn or Sb}$_x${P or As or Sb}$_y${S or Se or Te}$_z$.

Example 1

Figure 4:
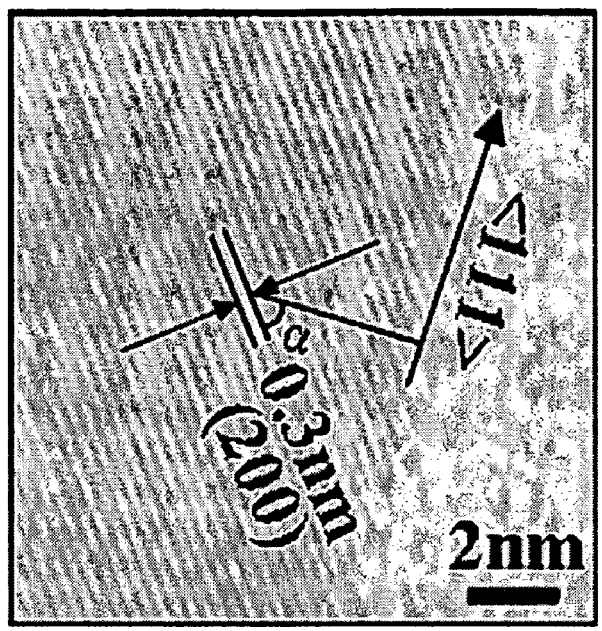
FIG. 4 is a high-resolution transmission electron microscopic image indicating the atomic structure of GST nanowire.

GST nanowires have been prepared in the apparatus as shown in FIG. 1B. The substrate is silicon wafer or thermally oxidized $SiO_2$ layered Si substrate, coated with 20 nm diameter gold (Au) nanoparticles. An evacuated quartz tube of diameter 2.54 cm is used as the reaction chamber in which Ar, $N_2$, He or another inert gas (p=200 Torr) flows at 25-50 sccm. A solid source of 0.1 gm mass includes a mixture of highly pure GeTe and $Sb_2Te_3$ powders with a mole ratio of 2:1. The temperature for many sources is in a range of 680-720° C., but may be as low as 450° C. or as high as 1000° C., and substrate temperature is 420-550° C. After 2 hours of growth, high-density of GST nanowires were obtained on the substrate. The morphology and microstructure of GST nanowires grown by this method are shown in FIGS. 2-4.

Example 2

The same apparatus shown in FIG. 1B is used. The solid source is Ge powder and $Sb_2Te_3$ powder. The substrate is the same as that used in Example 1. The temperatures around the Ge source and $Sb_2Te_3$ source are about 950° C. and 450-700° C., respectively. GST nanowires grow at about 450-520° C. Ar with 20 percent $H_2$ (200 Torr) flows at 25 sccm as carrier gas. The growth time is about 1 hour. The morphology and microstructure of the Ge—Sb—Te alloy nanowires are similar to that grown in Example 1.

Example 3

The same apparatus as shown in FIG. 1A is used. The solid source and substrate are the same as that used in Example 1. The temperature around the source is 450° C. and substrate temperature is 335-375° C. Ar (20 Torr) flows at 70 sccm as the carrier gas. The growth time is about 4 hours.

Example 4

Figure 5:
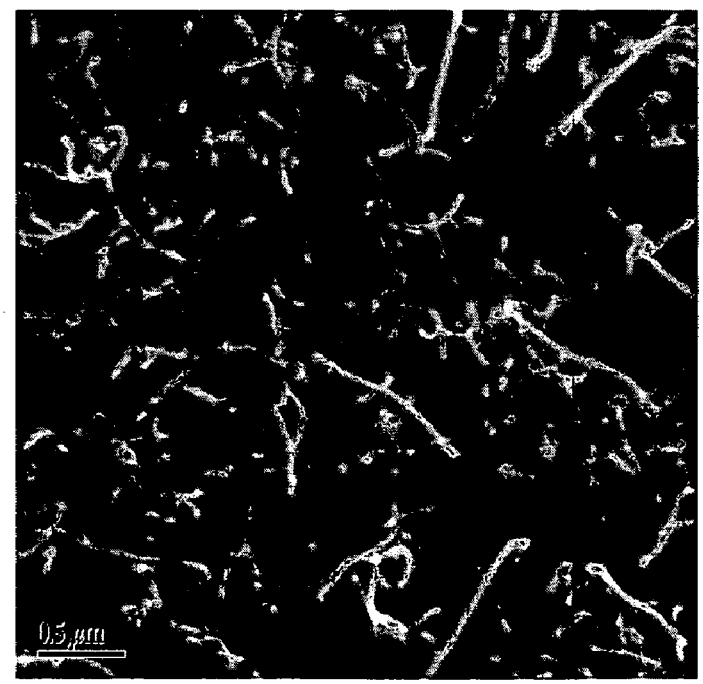
FIG. 5 is a scanning electron microscopy (SEM) image showing the morphology of GST nanorods grown from the mixture of GeTe and $Sb_2Te_3$.
Figure 6:
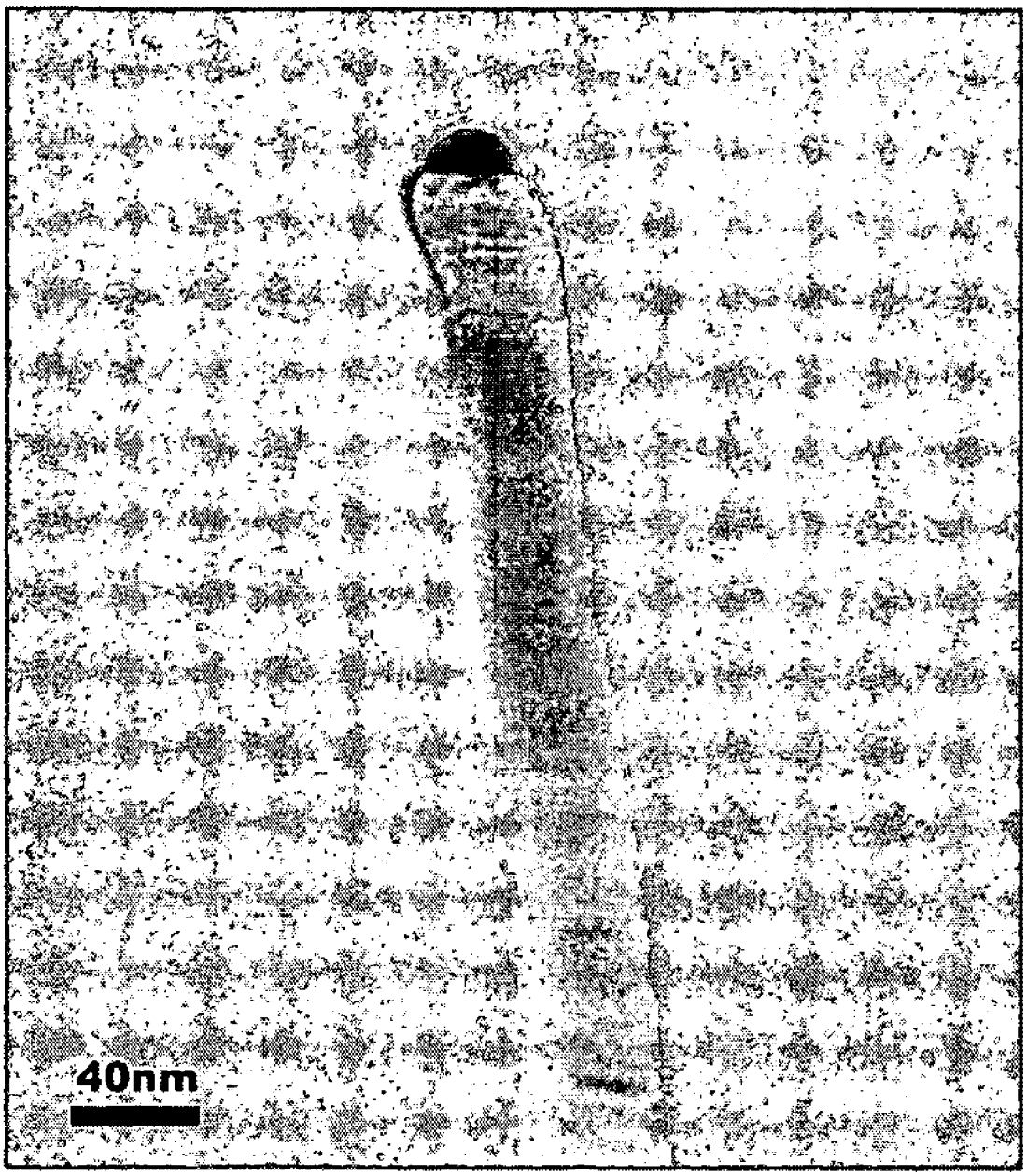
FIG. 6 is a transmission electron microscopic image taken from GST nanorod grown from the mixture of GeTe and $Sb_2Te_3$.

The same apparatus used as in Example 1. The solid source, substrate and all the experiment conditions (temperature, pressure, carrier gas and flow rate) are same as used in Example 1. The growth time is about 45 minutes. The GST nanorods are grown on the substrate. The morphology and microstructure of GST nanowires grown by this method are shown in FIGS. 5 and 6.

The methods discussed in the preceding allow growth of nanostructure compounds of one or more of {S and Se and Te}, combined with one or more of {Al and Ga and In and Tl and Ge and Sb and Sn} and combined with one or more of {P and As and Sb}; or growth of nanostructure compounds of {S and/or Se and/or Te}, combined with one or more of {Ge and Sn and Sb} and combined with one or more of {P and As and Sb}. Some of the nanostructure compounds have relatively low melt temperatures.

What is claimed is:

1. A method for growth of an alloy for use in a nanostructure, the method comprising:
   providing a substrate comprising Si, on which is deposited at least one of (i) a thin film coating of Au and (ii) a spaced apart array of thin particles of at least one of Au, Ni, Ti, Cr, In, Sb, Ge and Te, having a thickness in a range of 0.5-100 nm, with a substrate temperature in a range of about 330° C.-550° C., where at least a portion of the thin film coating or thin particle array serves as a catalyst for growth of nanostructures on a selected surface of the substrate;

providing at least first and second chemical sources, with the first source comprising $Ge_wTe_x$ and the second source comprising $Sb_yTe_z$, where the numbers w, x, y and z have substantially the ratios w:x and y:z=2:2 and 2:3, respectively, and where the first and second sources each have source temperatures in a range 450° C.$\leq$T$\leq$720° C., adjacent to the substrate;

allowing at least a portion of the first source and at least a portion of the second source to become first and second vapors, respectively, and to combine to form a resulting vapor comprising $Ge_pSb_qTe_r$, where p, q and r are positive numbers in ranges permitted by oxidization states associated with the respective elements Ge, Sb and Te, where the numbers p, q and r have substantially the ratios p:q:r=2:2:5; and exposing the selected surface of the substrate to the vapor comprising $Ge_pSb_qTe_r$ for a selected time interval, whereby at least one nanostructure is grown on the selected surface.

2. The method of claim 1, further comprising choosing said numbers p, q and r so that said nanostructure has a melt temperature no more than about 500° C.

3. The method of claim 1, further comprising choosing said numbers p, q and r so that said nanostructure has a melt temperature no more than about 400° C.

4. The method of claim 1, further comprising choosing said at least one nanostructure to be at least one of a nanowire, a nanorod and a nanotube.

5. The method of claim 1, further comprising choosing said substrate to comprise at least one of Si, $SiO_x$-coated Si ($1\leq x\leq 2$), $Al_2O_3$, SiC and SiN.

6. A method for growth of an alloy for use in a nanostructure, the method comprising:

providing a substrate comprising Si, on which is deposited at least one of (i) a thin film coating of Au and (ii) a spaced apart array of thin film islands of particles of at least one of Au, Ni, Ti, Cr, In, Sb, Ge and Te, having a thickness in a range of 0.5-100 nm, with a substrate temperature in a range of about 330° C.-550° C., where at least a portion of at least one of the thin film islands serves as a catalyst for growth of nanostructures on a selected surface of the substrate;

providing at least first and second chemical sources, with the first source comprising a first combination of (i) at least one of Ge, In, Sb, Ga, Sn, Te, Se and S and (ii) at least one of Te, Se and S, and the second source comprising a second combination of (iii) at least one of Ge and Sb, and (iv) at least one of Te, Se and S, where the first and second sources each have source temperatures in a range 450° C.$\leq$T$\leq$1000° C., adjacent to the substrate;

allowing at least a portion of the first source and at least a portion of the second source to become first and second vapors, respectively, and to combine to form a resulting vapor comprising at least one of $Ge_{x1}Te_{y1}$, $In_{x2}Sb_{y2}$, $In_{x3}Se_{y3}$, $Sb_{x4}Te_{y4}$, $Ga_{x5}Sb_{y5}$, $Ge_{x6}Sb_{y6}Te_{z6}$, $In_{x7}Sb_{y7}Te_{z7}$, $Ga_{x8}Se_{y8}Te_{z7}$, $Sn_{x9}Sb_{y9}Te_{z9}$, $In_{x10}Sb_{y10}Ge_{z10}$, where wa, xa, yb and zb (a=1-10, b=6-10) are numbers consistent with oxidization states (2, 3, 4, 5, 6) of the corresponding elements and have substantially the ratios x1:y1=1:1, x2:y2=1:1, x3:y3=2:3, x4:y4=1:3, x5:y5=1:3, x6:y6:z6=2:2:5, x7:y7:z7=1:1:2, x8:y8:z8=2:3:2 or x8:y8:z8=2:2:3, x9:y9:z9=2:2:5, and x10:y10:z10=2:2:3; and exposing the selected surface of the substrate to the resulting vapor for a selected time interval, whereby at least one nanostructure is grown on the selected surface.

7. The method of claim 6, further comprising choosing said first and second combinations so that said nanostructure has a melt temperature no more than about 500° C.

8. The method of claim 6, further comprising choosing said first and second combinations so that said nanostructure has a melt temperature no more than about 400° C.

9. The method of claim 6, further comprising choosing said at least one nanostructure to be at least one of a nanowire, a nanorod and a nanotube.

10. The method of claim 6, further comprising choosing said substrate to comprise at least one of Si, $SiO_x$-coated Si ($1\leq x\leq 2$), $Al_2O_3$, SiC and SiN.

* * * * *

UNITED STATES PATENT AND TRADEMARK OFFICE
CERTIFICATE OF CORRECTION

PATENT NO. : 7,655,497 B1  
APPLICATION NO. : 11/513431  
DATED : February 2, 2010  
INVENTOR(S) : Yu et al.

Page 1 of 1

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 356 days.

Signed and Sealed this

Twenty-third Day of November, 2010

David J. Kappos
*Director of the United States Patent and Trademark Office*